United States Patent [19]

Mihara

[11] Patent Number: 5,212,109

[45] Date of Patent: May 18, 1993

[54] METHOD FOR FORMING PN JUNCTION ISOLATION REGIONS BY FORMING BURIED REGIONS OF DOPED POLYCRYSTALLINE OR AMORPHOUS SEMICONDUCTOR

[75] Inventor: Teruyoshi Mihara, Yokohama, Japan

[73] Assignee: Nissan Motor Co., Ltd., Yokohama, Japan

[21] Appl. No.: 762,264

[22] Filed: Sep. 20, 1991

Related U.S. Application Data

[63] Continuation of Ser. No. 528,206, May 24, 1990, abandoned.

[30] Foreign Application Priority Data

May 24, 1989 [JP] Japan .................. 1-128641

[51] Int. Cl.⁵ .................................. H01L 21/76
[52] U.S. Cl. .................................. 437/67; 437/79; 437/78; 437/66; 437/62; 437/74
[58] Field of Search .............. 357/59, 50, 47, 48, 357/49, 2; 437/78, 79, 66, 62, 74, 67

[56] References Cited

U.S. PATENT DOCUMENTS

| | | | |
|---|---|---|---|
| 3,648,128 | 3/1972 | Kobayashi | 317/235 |
| 3,838,490 | 9/1974 | McCaffrey et al. | 357/43 |
| 3,871,007 | 3/1975 | Wakamiya et al. | 357/49 |
| 3,990,102 | 11/1976 | Okuhara et al. | 357/49 |
| 4,454,647 | 6/1984 | Joy et al. | 437/78 |
| 4,485,551 | 12/1984 | Soclof | 437/62 |
| 4,633,290 | 12/1986 | Poppert et al. | 357/42 |
| 4,805,008 | 2/1989 | Yao et al. | 357/42 |
| 4,833,098 | 5/1989 | Kato | 437/67 |
| 4,879,584 | 11/1989 | Takagi et al. | 357/43 |
| 4,881,115 | 11/1989 | Lesk et al. | 357/64 |
| 4,884,117 | 11/1989 | Neppl et al. | 357/43 |
| 4,888,300 | 12/1989 | Burton | 437/61 |
| 5,008,208 | 4/1991 | Liu et al. | 437/67 |
| 5,049,968 | 9/1991 | Nakagawa et al. | 357/50 |

FOREIGN PATENT DOCUMENTS

| | | |
|---|---|---|
| 0191476 | 8/1986 | European Pat. Off. . |
| 0223694 | 5/1987 | European Pat. Off. . |
| 2324384 | 11/1973 | Fed. Rep. of Germany ........ 357/55 |
| 2156149 | 10/1985 | United Kingdom .................. 437/62 |

Primary Examiner—Brian E. Hearn
Assistant Examiner—Trung Dang
Attorney, Agent, or Firm—Foley & Lardner

[57] ABSTRACT

In a semiconductor device having island regions formed in a surface area of a substrate, the island regions are electrically isolated from the substrate via buried regions formed of polycrystalline or amorphous semiconductor, without use of epitaxial growth technique. Since the polycrystalline or amorphous semiconductor includes a great number of recombination centers, parasitic operation between the elements formed on the semiconductor substrate can be prevented. Further, the buries regions are excellent in heat conductivity, the breakdown resistance against surge voltages or static electricity can be improved. Furthermore, when applied to a CMOS, it is possible to prevent latch up action caused by a parasitic thyristor formed in the CMOS, by the presence of the buried regions including a great number of recombination centers.

8 Claims, 8 Drawing Sheets

METHOD FOR FORMING PN JUNCTION ISOLATION REGIONS BY FORMING BURIED REGIONS OF DOPED POLYCRYSTALLINE OR AMORPHOUS SEMICONDUCTOR

This application is a continuation of application Ser. No. 07/528,206, filed May 24, 1990, now abandoned.

BACKGROUND OF THE INVENTION

1. Field of the Invention

The present invention relates to a semiconductor device including an island region formed in a surface area of a method of producing substrate, buried regions surrounding the island region for isolating the island region from the substrate.

2. Description of the Background Art

Figure 1:
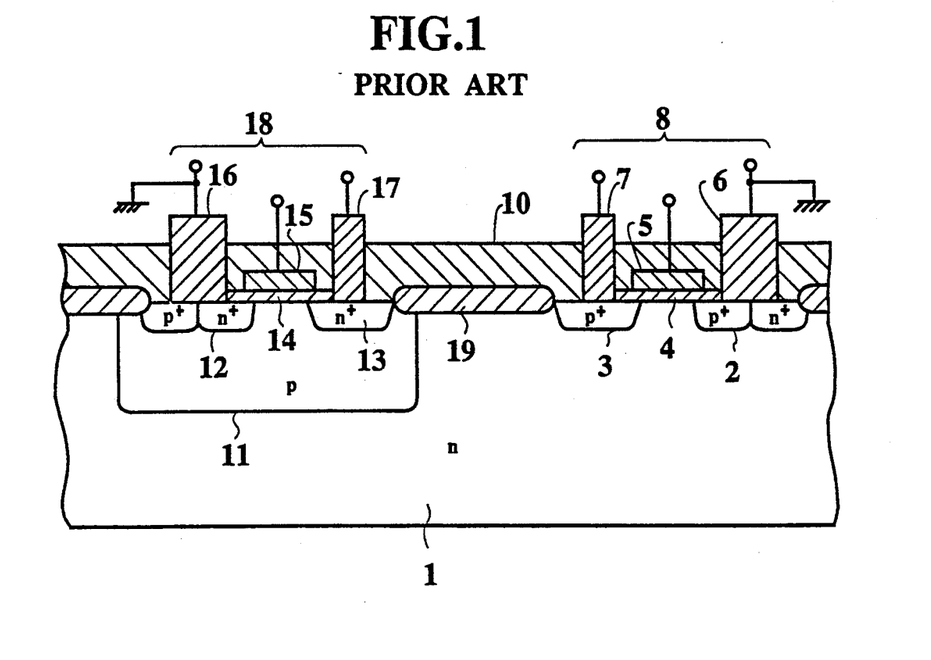
FIGS. 1 to 3 are longitudinal cross sections of conventional semiconductor devices.

In FIG. 1, there is shown a conventional semiconductor device such as a CMOS, in which MOSs are electrically separated from one another by using a self-separation method in order to avoid a mutual intervention between them. In a front surface area of an n-type substrate 1, p+-type source and drain regions 2 and 3 are formed at a certain distance away from each other, and a gate electrode 5 is formed on the substrate 1 via a gate oxide film 4 interposed therebetween between the source and drain regions 2 and 3 to obtain a p-channel MOSFET (pMOS) 8 in the right hand side portion of the substrate 1. A p-type well region 11 is also formed in the front surface area of the substrate 1. A pair of n+-type source and drain regions 12 and 13 are formed in the surface area of the well region 11, and a gate electrode 15 is formed on the well region 11 via a gate oxide film 14 interposed therebetween between the source and drain regions 12 and 13 to obtain an n-channel MOSFET (nMOS) 18 in the left hand side portion of the substrate 1.

The pMOS 8 and the nMOS 18 each are surrounded by a field oxide film 19 formed in the surface area of the substrate 1 in order to separate the pMOS and the nMOS from each other. An insulating film 10 covers the entire surface of the obtained pMOS 8 and nMOS 18 in the substrate 1. A pair of source and drain electrodes 6 and 7 penetrate the insulating film 10 and are connected to the respective source and drain regions 2 and 3 in the pMOS 8. A pair of source and drain electrodes 16 and 17 penetrate the insulating film 10 and are connected to the respective source and drain regions 12 and 13 in the nMOS 18. In this CMOS device, the n-type substrate 1 is connected to a power source $V_{DD}$ (>0), and the p-type well region 11 is coupled to a low voltage point, thereby electrically isolating the pMOS 8 and the nMOS 18 from each other. Thus, the pMOS 8 and the nMOS 18 can be operated independently.

However, in this CMOS device, there is provided a parasitic thyristor which is composed of a series of the p+-type source region 2, the n-type substrate 1, the p-type well region 11 and the n+-type source region 12, and hence latch up is apt to be caused.

Figure 2:
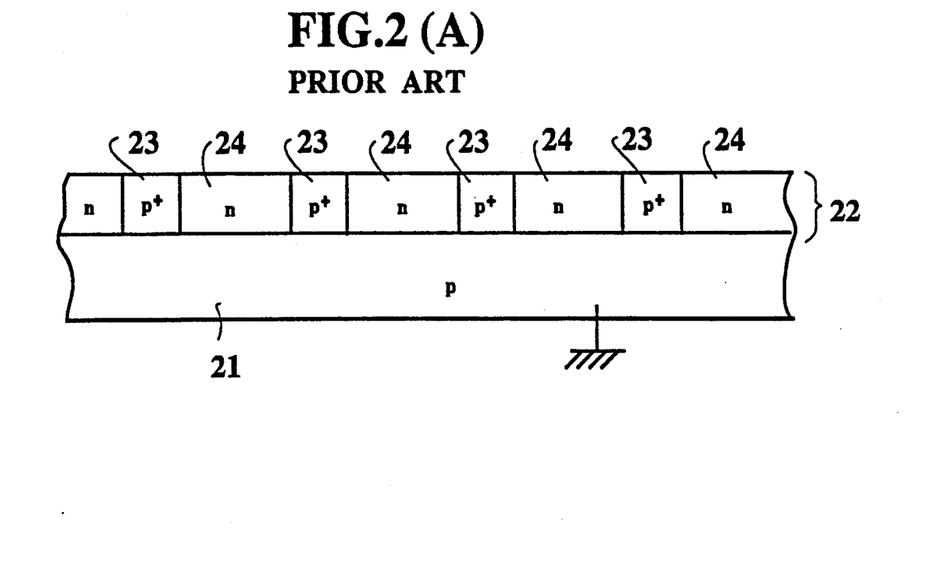

In FIG. 2, there is shown a conventional bipolar IC device where npn and pnp transistors are separated by using a junction separation method, i.e., a pn junction formed between the transistors. This bipolar IC device is fabricated as follows.

As shown in FIG. 2A, firstly, an n-type epitaxial layer 22 is grown on a p-type substrate 21, and p+-type separation diffusion regions 23 are formed in the epitaxial layer 22 so as to reach the substrate 21 to obtain n-type island regions 24 between the separation diffusion regions 23. Then, as shown in FIG. 2B, a p-type base region 25 is formed in one n-type island region 24 as a collector region, and an n+-type emitter region 26 is formed in the surface area of the p-type base region 25. An n+-type collector contact region 27 is formed in the island region 24 to obtain an npn transistor 28. In another n-type island region 24 as a base region, p+-type emitter and collector regions 29 and 30 and an n+-type base contact region 31 are separately formed in the surface area to obtain a pnp transistor 32. An n+-type buried region 33 is formed in advance between the p-type substrate 21 and the n-type island region 24. In this case, the substrate 21 is connected to a low voltage point to electrically separate the n-type island regions 24 from one another by the p+-type separation regions 23. Hence, the npn transistor 28 and the pnp transistor 32 can be operated independently.

However, in this case, an epitaxial growing method is essential, and a process cost is expensive to invite increase of a tip producing cost.

Figure 3:
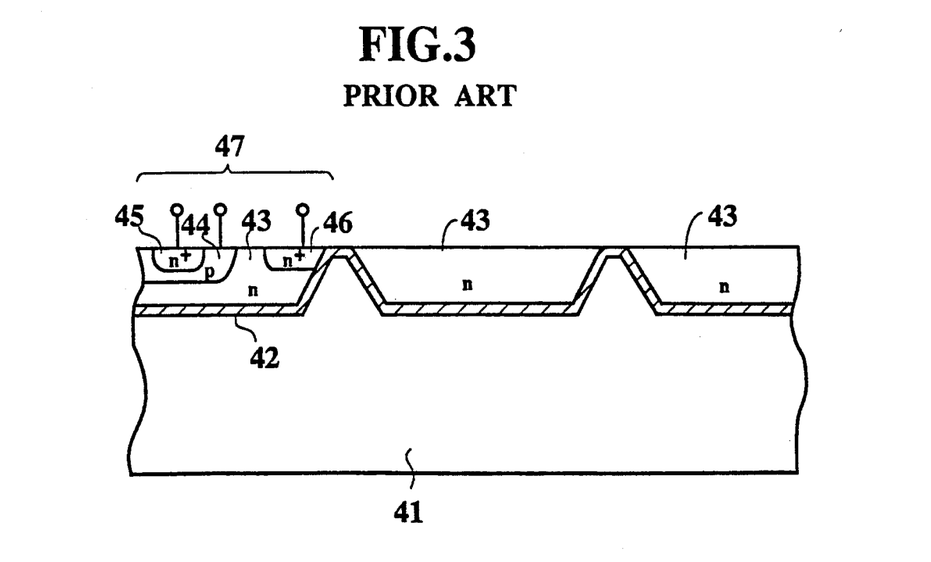

In FIG. 3, there is shown a further conventional semiconductor device where transistors are separated from one another by using a dielectric separation method, i.e., an insulating film. As shown in FIG. 3, in a semiconductor substrate 41 such as a polycrystalline silicon, n-type island regions 43 are formed in the surface area via an insulating film 42 of $SiO_2$ or the like for separating the island regions 43 from the substrate 41. In one island region 43 as a collector region, a p-type base region 44 is formed in the surface area, and an n+-type emitter region 45 is formed in the surface area of the base region 44. An n+-type collector contact region is also formed in the island region 43 to obtain an npn transistor 47. The transistors each formed in each island region 43 can be operated independently.

However, in this case, since the island regions 43 are separated by the insulating film 42, heat radiation property is bad, and destruction resisting properties against serge voltage and static electricity are low.

SUMMARY OF THE INVENTION

Accordingly, it is an object of the present invention to provide a semiconductor device in view of the above described defects and disadvantages of the prior art, which is capable of preventing a parastic action such as latch up to be caused between device units formed in island regions or in an island region and on a substrate, which has good heat radiation property and good destruction resisting properties against serge voltage and static electricity, and in which isolated island regions can be formed without using an epitaxial growing method to reduce a chip producing cost.

In accordance with one aspect of the present invention, there is provided a semiconductor device, comprising a semiconductor substrate having a first conductivity type, at least one island region formed in a surface area of the semiconductor substrate, the island region including one of a MOS and a bipolar transistor therein, and at least one buried region composed of one of a polycrystalline semiconductor and an amorphous semiconductor, the buried region surrounding the island region to separate the island region from the substrate.

In accordance with another aspect of the present invention there is provided a semiconductor device, comprising a semiconductor substrate having a first conductivity type, at least two island regions formed in a surface area of the semiconductor substrate, one island region having a second conductivity type opposite to the first conductivity type and including a first conductivity type-channel MOS in a surface area thereof, another island region having the first conductivity type and including a second conductivity type-channel MOS in a surface area thereof, the two MOSs constituting a CMOS, and at least two buried regions each composed of one of a polycrystalline semiconductor and an amorphous semiconductor, each buried region surrounding each island region to separate the island region from the substrate.

DESCRIPTION OF THE PREFERRED EMBODIMENTS

Figure 4:
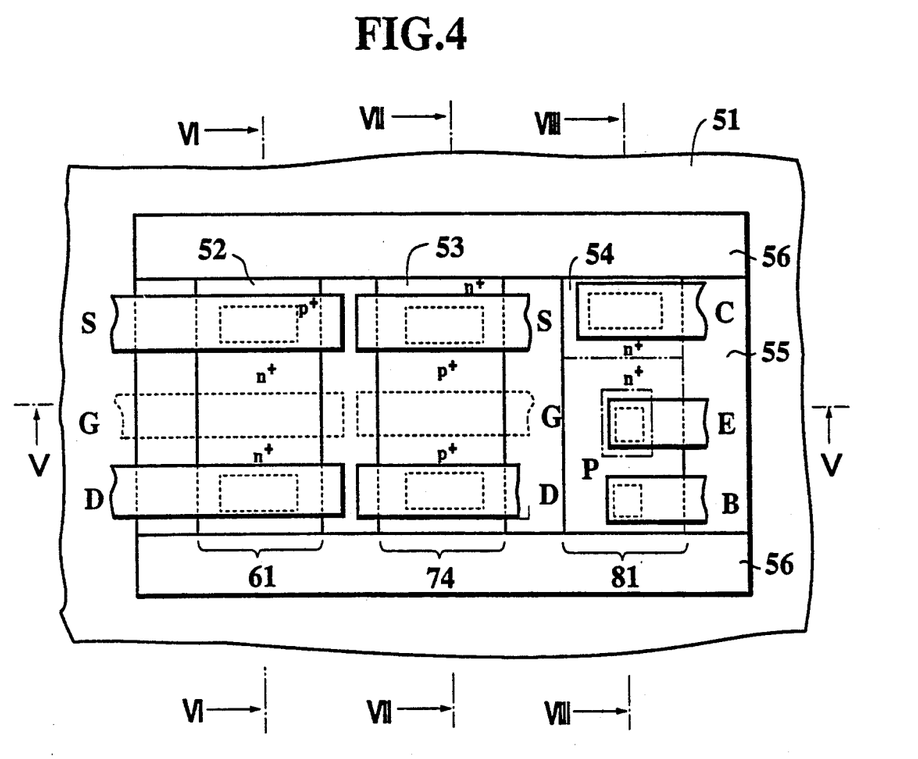
FIG. 4 is a top plan view of a first embodiment of a semiconductor device according to the present invention.

Referring now to the drawings, wherein like reference characters designate like or corresponding parts throughout the several views and thus the repeated description thereof may be omitted for the brevity, there is shown in FIGS. 4 to 7 the first embodiment of a semiconductor device according to the present invention. In FIG. 4, a field oxide film 62 and an insulating film 63 are omitted for easy understanding.

Figure 5:
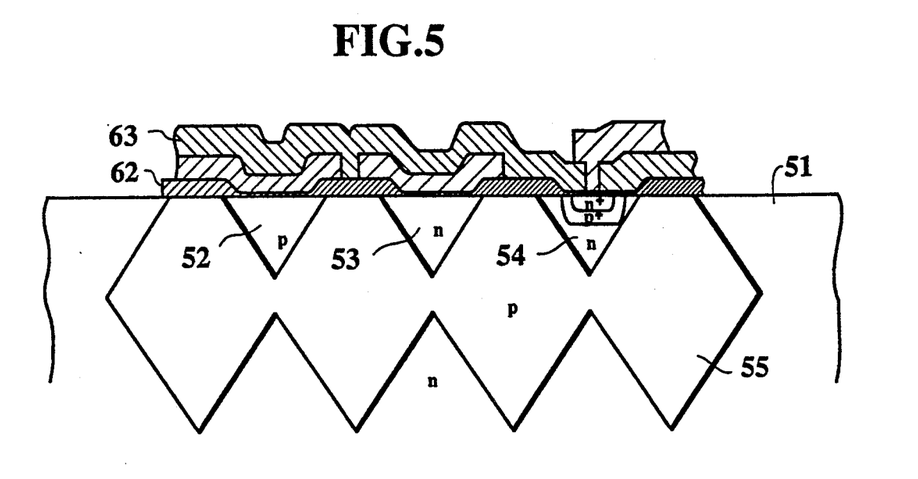
FIG. 5 is a longitudinal cross section, taken along the line V—V in FIG. 4.

In the drawings, in a surface area of an n-type (or p-type may be possible) silicon semiconductor substrate 51, a plurality of island regions, for example, a p-type island region 52, an n-type island region 53 and an n-type island region 54 are surrounded and isolated by p-type polycrystalline or amorphous silicon buried regions 55 and 56 away from the substrate 51. The buried regions 55 and 56 are connected to a low voltage point.

Figure 6:
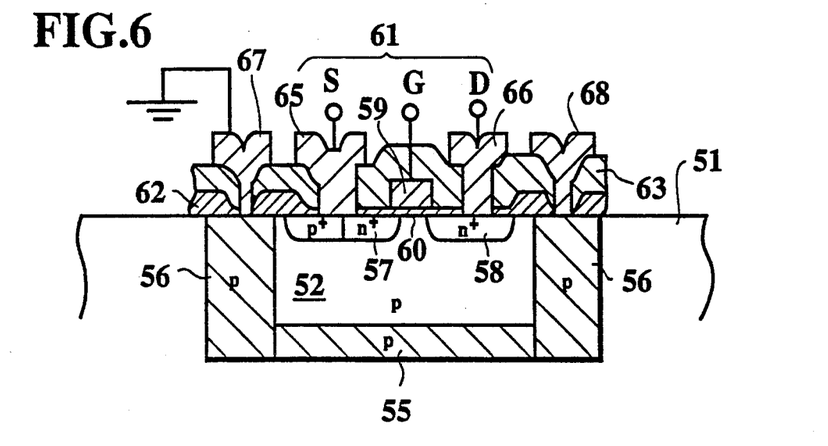
FIG. 6 is a longitudinal cross section, taken along the line VI—VI in FIG. 4.

In the p-type island region 52, as clearly shown in FIG. 6, n+-type source and drain regions 57 and 58 are formed at a certain distance away from each other in the surface area, and a gate electrode 59 of polycrystalline silicon is formed on the p-type island region 52 via a gate oxide film 60 between the source and drain regions 57 and 58 to obtain an nMOS 61. A field oxide film 62 formed on the substrate 51 surrounds the nMOS 61, and the entire surface of the obtained device is covered by an insulating film 63. Two source and drain electrodes 65 and 66 are connected to the respective source and drain regions 57 and 58 through the insulating film 63. A pair of electrodes 67 and 68 is also connected to the buried regions 56 through the insulating film 63.

Figure 7:
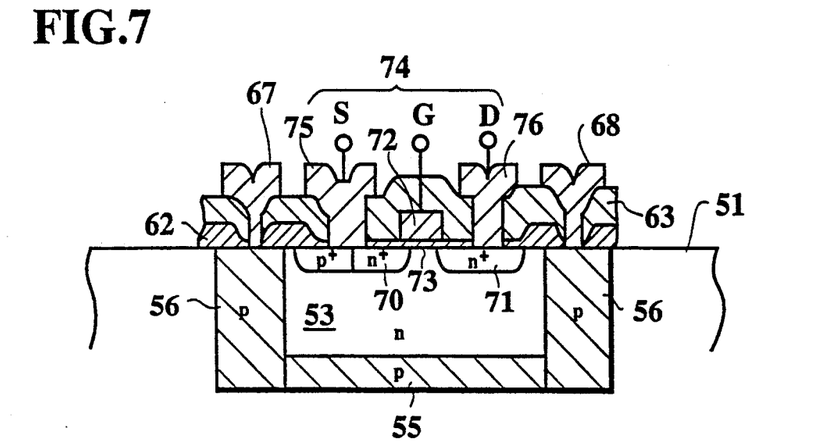
FIG. 7 is a longitudinal cross section, taken along the line VII—VII in FIG. 4.

In the n-type island region 53, as clearly shown in FIG. 7, p+-type source and drain regions 70 and 71 are formed at a certain distance away from each other in the surface area, and a gate electrode 72 of polycrystalline silicon is formed on the n-type island region 53 via a gate oxide film 73 between the source and drain regions 70 and 71 to obtain a pMOS 74. Two source and drain electrodes 75 and 76 are connected to the respective source and drain regions 70 and 71 through the insulating film 63.

Figure 8:
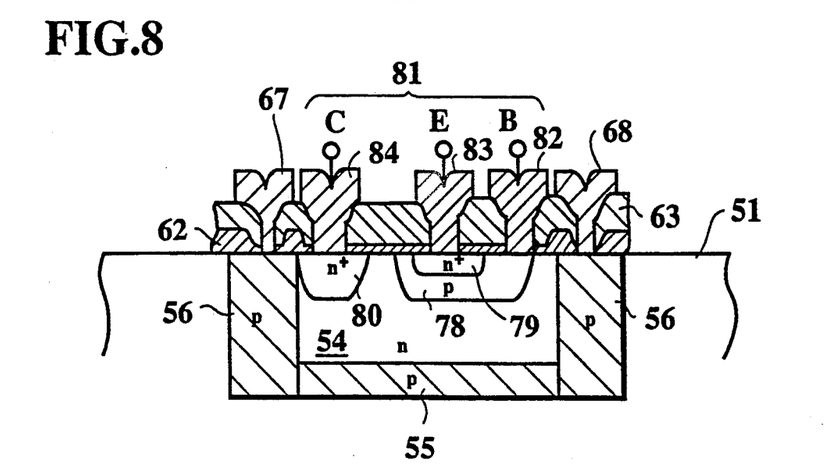
FIG. 8 is a longitudinal cross section, taken along the line VIII—VIII in FIG. 4.

In the n-type island region 54 as a collector region, as clearly shown in FIG. 8, a p-type base region 78 is formed in the surface area, and an n+-type emitter region 79 is formed in the surface area of the base region 78. A collector contact region 80 is formed in the surface area of the island region 54 away from the base region 78 to obtain an npn transistor 81 in the n-type island region 54. Three base, emitter and collector electrodes 82, 83 and 84 are connected to the respective base, emitter and collector contact regions 78, 79 and 80 through the insulating film 63.

In this embodiment, the nMOS 61 and pMOS 74 constitute a CMOS. In this case, by applying a reverse bias to the pn junction between the n-type island region 53 or 54 and the p-type buried region 55 or 56, these two regions 53 or 54 and 55 or 56 can be electrically separated. Since a substrate voltage (low voltage) is applied in common to the p-type island region 52 and the p-type buried regions 55 and 56, there is no need of a pn junction or there is no pn junction between the p-type island region 52 and the p-type buried regions 55 and 56. However, when the p-type island region 52 is formed by doping a p-type impurity into an n-type region, a part of the n-type region may be left as it is, or may not be changed to the p-type region so that the n-type region can exist between the p-type island region 52 and the p-type buried regions 55 and 56, thereby electrically separating the p-type island region 52 and the p-type buried regions 55 and 56 by the pn junction between the p-type buried regions 55 and 56 and the n-type region interposed between the p-type island region 52 and the p-type buried regions 55 and 56.

As described above, in this embodiment, the island regions 52, 53 and 54 can be formed without using an epitaxial growing method. The polycrystalline or amorphous silicon of the buried regions 55 and 56 includes many recombination centers as compared with monocrystalline silicon, and hence the gain sum of the parastic thyristor of the CMOS satisfies the following formula:

$$\alpha NPN + \alpha PNP < 1$$

Accordingly, the cause of the latch up can be completely prevented. Further, since the polycrystalline or amorphous silicon has good heat conductivity, even when a transient serge voltage or static electricity is applied to the semiconductor device from the terminals or the like, the destruction resisting properties against the serge voltage and the static electricity can be largely improved.

Figure 9:
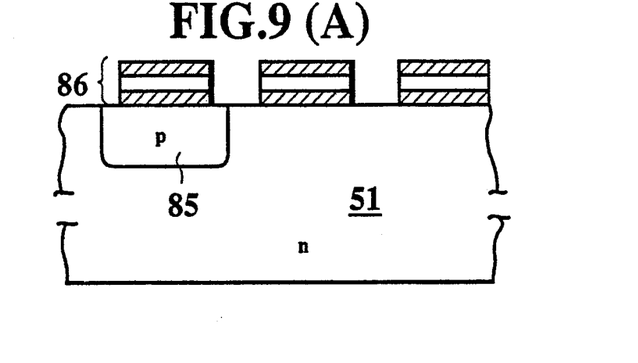
FIGS. 9A to 9E are cross sectional views showing a process for producing a semiconductor device shown in FIG. 4.

One embodiment of a method for producing the semiconductor device described above according to the present invention will now be described in detail in connection with FIGS. 9A to 9E, wherein FIGS. 9B and 9D each include a reduced plan view.

In FIG. 9A, a p-type region 85 is formed in the surface area of an n-type silicon substrate 51 having (100) surface in order to provide a p-type island region later, and a three-layer laminate insulating film 86 composed of two $SiO_2$ layers and an $Si_3N_4$ layer interposed therebetween as a pattern mask is attached to the substrate 51.

In FIG. 9B, vertical grooves 87 are formed in the surface area of the substrate 51 using the laminate insulating film mask 86 by a reactive ion etching method.

In FIG. 9C, the side walls of the vertical grooves 87 are etched by using an alkaline anisotropic etching solution such as hydrazine or ethylenediamine to form enlarged grooves 88 and the p-type and n-type island regions 52, 53 and 54 having a triangular cross section. During the etching of the silicon by using such an alkaline anisotropic etching solution, the etching rate is remarkably delayed at (111) surfaces when the (111) surfaces are exposed, and hence the island regions 52, 53 and 54 can be suitably cut out without any difficulty.

In FIG. 9D, the enlarged grooves 88 are filled up with a p-type doped polycrystalline or amorphous silicon to obtain the p-type polycrystalline or amorphous silicon buried regions 55 and 56 for completely separating the island regions 52, 53 and 54 from the substrate 51.

In FIG. 9E, the surface portions of the p-type polycrystalline or amorphous silicon of the buried regions 55 and 56 are oxidized to form an oxide film 62 having a thickness of approximately 7000 Å on the surface in a conventional manner to obtain a substrate board. Then, the necessary nMOS, pMOS and bipolar transistor are formed in the island regions 52, 53 and 54 in a conventional manner, thereby obtaining a semiconductor device according to the present invention. In this embodiment, as described above, the p-type and n-type island regions 52, 53 and 54 can be formed without using the epitaxial growing method.

In this embodiment, although the grooves are formed by using the anisotropic etching method, however, an isotropic etching method can be also used instead of the anisotropic etching.

Figure 10:
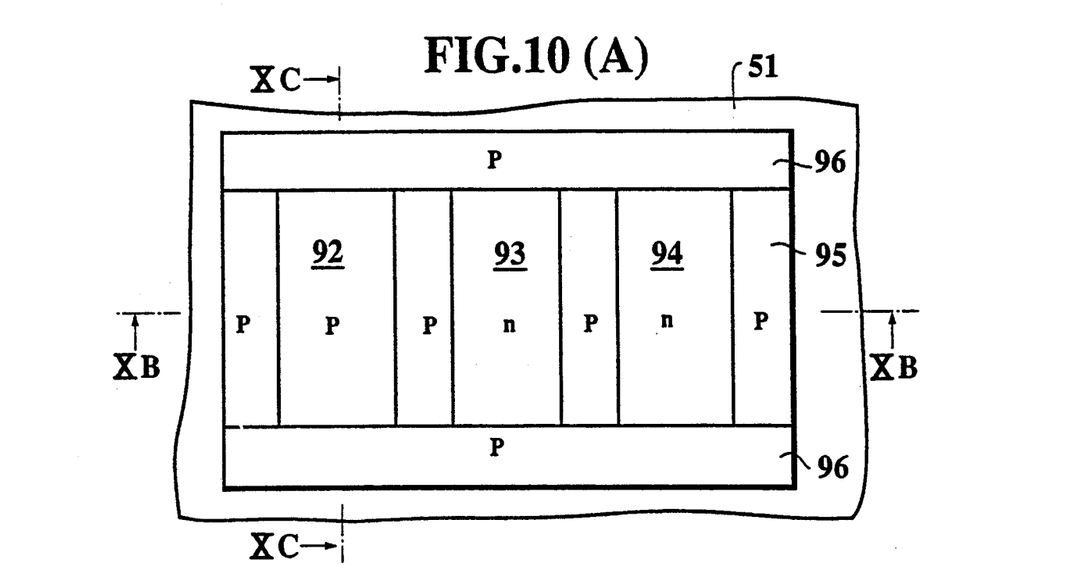
FIG. 10A is a top plan view of a second embodiment of a semiconductor device according to the present invention.
FIG. 10B is a longitudinal cross section, taken along the line XB—XB in FIG. 10A.
FIG. 10C is a longitudinal cross section, taken along the line XC—XC in FIG. 10A.

In FIGS. 10A to 10C, there is shown the second embodiment of the semiconductor device according to the present invention, having the same construction as the first embodiment of the semiconductor device shown in FIGS. 4 to 9 except that a p-type island region 92, an n-type island region 93 and an n-type island region 94 surrounded by p-type polycrystalline or amorphous buried regions 95 96 are formed deeper than the island regions 52, 53 and 54 shown in FIG. 5 so that the island regions 92, 93 and 94 are also provided with respective vertical side walls 92a, 93a and 94a in their upper halves portions.

In this embodiment, since the upper halves of the island regions 92, 93 and 94 are formed with the vertical side walls 92a, 93a and 94a, the effective area of the island regions 92, 93 and 94 are largely improved in the depth direction, and hence it is very much convenient for devices requiring a certain thickness to be formed in the island regions 92, 93 and 94. Of course, the CMOS and the bipolar transistor shown in FIGS. 4 to 9 can be formed in the island regions in the same manner as the first embodiment described above.

In a method for producing the semiconductor device shown in FIG. 10A to 10C, the process is carried out in the same manner as the first embodiment described above, except that an etching-proof film of $Si_3N_4$ or the like is coated on side walls of vertical grooves, corresponding to the upper half vertical side walls 92a, 93b and 94b of the island regions 92, 93 and 94, in the middle of the formation of the vertical grooves in the surface area of the substrate 51 in the same manner as the step shown in FIG. 9B.

Figure 11:
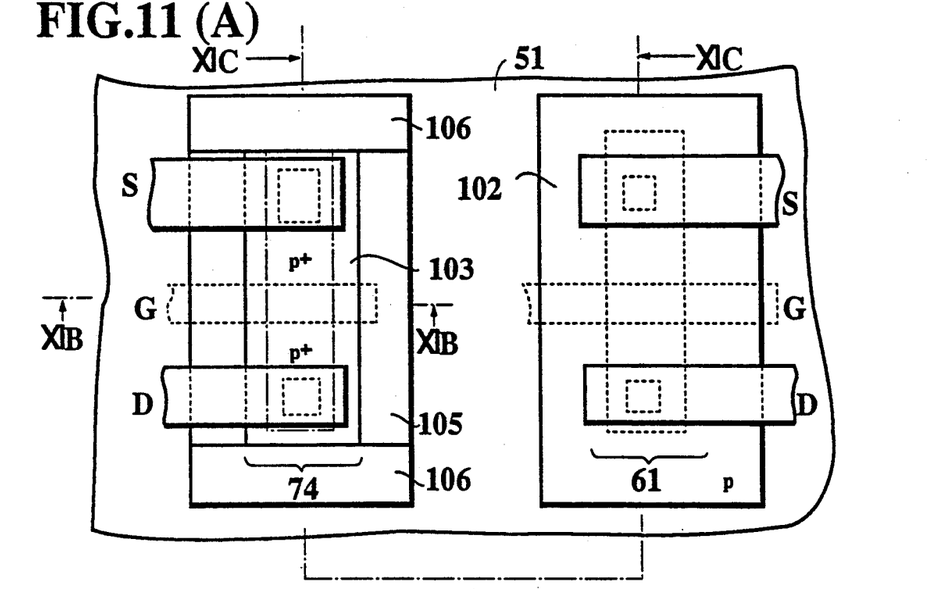
FIG. 11A is a top plan view of a third embodiment of a semiconductor device according to the present invention.
FIG. 11B is a longitudinal cross section, taken along the line XIB—XIB in FIG. 11A.
FIG. 11C is a longitudinal cross section, taken along the line XIC—XIC in FIG. 11A.

In FIGS. 11A to 11C, there is shown the third embodiment of the semiconductor device according to the present invention, having the same structure as the first embodiment shown in FIGS. 4 to 7, except for a bulk CMOS or a complementary MISFET. In FIG. 11A, the field oxide film 62 and the insulating film 63 are omitted for easy understanding.

In this embodiment, a p-type well region 102 is formed in a surface area of an n-type silicon semiconductor substrate 51, and an nMOS 61 having the same structure as the one shown in FIG. 6 is formed in the surface area of the p-type well region 102 in the same manner as described above. An n-type island region 103 surrounded by n-type polycrystalline or amorphous silicon buried regions 105 and 106 is also formed in the surface area of the substrate 51 in the same manner as the first embodiment shown in FIGS. 4 to 7 apart from the p-type well region 102 containing the pMOS 61 therein, and a pMOS 74 having the same structure as the one shown in FIG. 7 is formed in the surface area of the n-type island region 103 in the same manner as the first embodiment described above. Power sources $V_{SS}$ and $V_{DD}$ are connected to the source electrodes 65 and 75 of the MOSs 61 and 74, respectively.

In this embodiment, by providing the polycrystalline or amorphous silicon buried regions 105 and 106, a gain of a parasitic thyristor composed of a series of a $p^+$-type source region 70, the n-type island region 103, the n-type buried regions 105 and 106, the n-type substrate 51, the p-type well region 102 and an $n^+$-type source region 57, which is to be appeared between the nMOS 61 and the pMOS 74, can be reduced to avoid the cause of the latch up.

As described above, this embodiment is applied to a self-separation type CMOS, and hence the conductivity type of the buried regions 105 and 106 and the island region 103 is the same n-type. Further, in addition to the island region 103, the p-type well region 102 can be also formed in the form of an island region surrounded by p-type buried regions to more exactly prevent the cause of the latch up. Furthermore, in this embodiment, instead of the n-type island region 103, the p-type well region 102 can be formed in the form of an island region surrounded by p-type buried regions to prevent the cause of the latch up. That is, the nMOS 61 may be formed in the surface area of the p-type island region surrounded by the p-type buried regions, and the pMOS 74 may be formed in the surface area of the substrate.

What is claimed is:

1. A method of producing a semiconductor device having at least two island regions formed in a surface area of a substrate, comprising the steps of:
    (a) preparing a first conductivity type semiconductor substrate;

(b) forming a second conductivity type region by diffusion in the surface area of the substrate, to provide a second conductivity type island region later;

(c) forming an insulating film on the surface area of the substrate for masking of the surface area of the substrate, to provide first and second conductivity type island regions under the formed insulating film later;

(d) forming vertical grooves in the surface area of the substrate by etching on the basis of the formed insulating masking film, to form the island regions between the two adjacent vertical grooves;

(e) forming enlarged grooves and the first and second conductivity type island regions by etching side walls of the formed vertical grooves;

(f) filling up the enlarged grooves with a second conductivity type doped polycrystalline or amorphous semiconductor to obtain a buried region for enclosing the island regions so that the island regions are isolated from the substrate;

(g) partially forming an oxide film on only the surface area of the buried region by oxidization to obtain a substrate board; and (h) forming semiconductor elements in the formed island regions to produce a semiconductor device.

2. The method of claim 1, wherein the buried region in the steps (d), (e) and (f) is composed of two mutually perpendicular buried regions and, the two buried regions are formed in different vertical groove forming, enlarged groove forming and enlarged groove filling up steps, respectively to prevent the island regions from being mechanically separated from the substrate.

3. The method of claim 1, wherein the substrate is an n-type silicon substrate having (100) surface, and the side wall of the vertical grooves are etched by an alkaline anisotropic etching solution to allow etching rate to be remarkably delayed at exposed (111) surfaces.

4. The method of claim 1, wherein in the step (d), the etching method is a reactive ion etching method.

5. The method of claim 1, wherein the step (e), the formed island regions are triangular in cross section.

6. The method of claim 1, wherein in the step (e), the formed island regions are pentagonal in cross section.

7. The method of claim 5, wherein the pentagonal cross section island regions are formed by partially coating an etching-proof film on the side walls of the vertical grooves formed in the step (d) of claim 1, before forming the enlarged grooves and the island regions by etching.

8. The method of claim 1, wherein in the step (f), the enlarged grooves are partially filled up with a first conductivity type doped polycrystalline or amorphous semiconductor to obtain first conductivity type buried region, to form a complementary MISFET composed of a first conductivity type MOS formed in second conductivity type well region formed in a surface area of the substrate and a second conductivity type MOS formed in the first conductivity type island region isolated from the substrate by the first conductivity type buried regions.

* * * * *